United States Patent [19]

Sakai

[11] Patent Number: 4,546,274
[45] Date of Patent: Oct. 8, 1985

[54] NON-LINEAR INTEGRATION CIRCUIT

[75] Inventor: Koichi Sakai, Tokyo, Japan

[73] Assignee: Toko Kabushiki Kaisha, Tokyo, Japan

[21] Appl. No.: 482,463

[22] Filed: Apr. 6, 1983

[30] Foreign Application Priority Data

Apr. 15, 1982 [JP] Japan .................. 57-54675[U]

[51] Int. Cl.[4] ................... H03K 5/22; H03K 3/313; G06G 5/18
[52] U.S. Cl. ........................ 307/494; 307/317 R; 307/254; 328/127; 328/128
[58] Field of Search ............... 307/490, 494, 228, 359, 307/31; 328/127, 128, 181

[56] References Cited

U.S. PATENT DOCUMENTS

| | | | |
|---|---|---|---|
| 3,633,043 | 1/1972 | Anthony | 328/127 |
| 3,986,127 | 10/1976 | Ray | 307/494 |
| 4,156,229 | 5/1979 | Shawhan | 328/128 |
| 4,247,823 | 1/1981 | Kannon, Jr. | 328/127 |

Primary Examiner—Stanley D. Miller
Assistant Examiner—B. P. Davis
Attorney, Agent, or Firm—Stevens, Davis, Miller & Mosher

[57] ABSTRACT

In a non-linear integration circuit, an audio sine wave signal is processed by a rectifier circuit and a smoothing circuit so that a DC output is obtained according to the amplitude of the signal. A hybrid diode which is similar in voltage-current characteristic to a silicon diode and is referred to as an "analogous diode" is connected to the smoothing circuit, so that a DC output is obtained by means of the analogous diode in response to an abrupt change in amplitude of the input signal. The signal can be processed on a low supply voltage, and employment of the analogous diode provides an output which is similar to that which is provided by the use of a silicon diode.

7 Claims, 7 Drawing Figures

F I G. 3
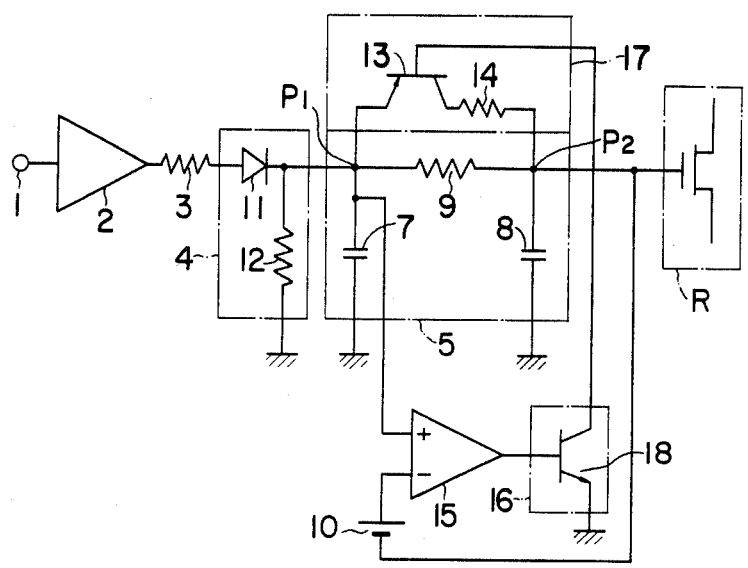
F I G. 4
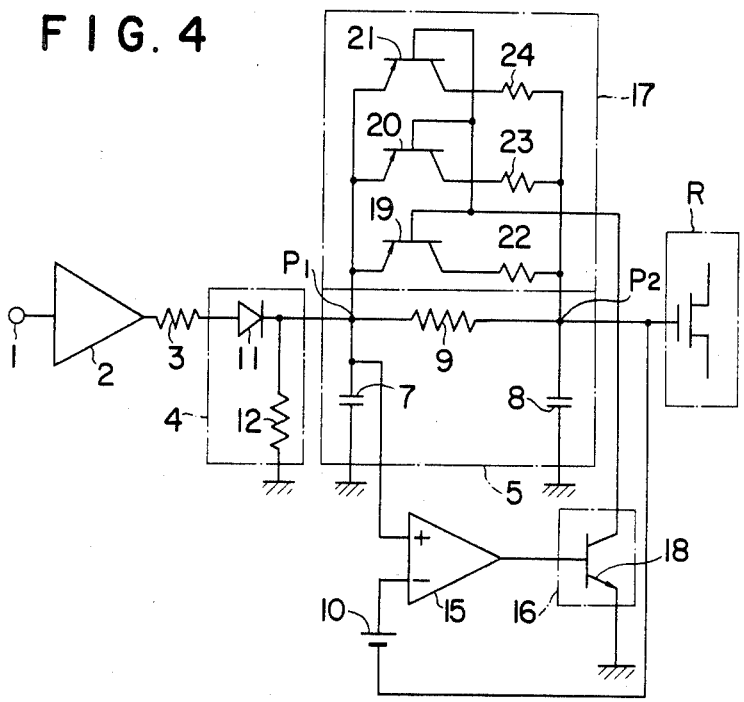

NON-LINEAR INTEGRATION CIRCUIT

BACKGROUND OF THE INVENTION

This invention relates to non-linear integration circuits, and more particularly to an improvement of a conventional non-linear integration circuit.

FIG. 1 shows a conventional non-linear integration circuit which is generally used. An audio signal is applied to an input terminal 1 and is then amplified by an amplifier 2. The signal thus amplified is applied through a resistor 3 and a half-wave rectifier circuit 4 to a smoothing circuit 5 with a diode 6, as a result of which a DC output is provided according to the amplitude of the input signal and is supplied to the impedance element R of a Field-Effect Type transistor, etc. FIG. 2 shows waveforms at each point of the above-described circuit. More specifically, part (I) of FIG. 2 shows the waveform of the amplified sine wave, part (II) shows the output waveform of the halfwave rectifier circuit 4 which includes ripples, and part (III) illustrates the output of the smoothing circuit 5 with the diode 6, which is a substantially direct current.

The function of the diode 6 included in the non-linear integration circuit in FIG. 1 will be described.

It is assumed that the diode 6 is eliminated from the integration circuit in FIG. 1 and the amplitude of the signal is abruptly increased as indicated at (A) in the part (I) of FIG. 2. In this case, the charging of a smoothing capacitor 8 is delayed by the time constant which is determined by a resistor 9 and the capacitor 8, as a result of which an output waveform as indicated by the dotted line (C) in part (III) of FIG. 2 is obtained. That is, if the integration circuit is not provided with the diode 6, then the circuit cannot respond to the abrupt amplitude change. On the other hand, in the case where the circuit includes the diode 6, when a signal whose amplitude exceeds the threshold level of the diode 6 is inputted, the current for charging the capacitor 8 flows through the diode 6 instead of the resistor 9. Therefore, a DC output corresponding to the input signal amplitude is obtained as indicated by the solid line (B) in part (III) of FIG. 2 without being delayed as indicated by the dotted line (C).

Thus, when the input signal amplitude is abruptly increased, the charging current flows quickly into the smoothing capacitor 8 through the diode 6; that is, the integration circuit can respond to the change of the input signal amplitude.

However, the above-described circuit still suffers from a problem if the diode 6 is a silicon diode. The threshold voltage of the silicon diode is about 0.7 volt. The silicon diode may be used in the case when the supply voltage is relatively high, but it cannot be used when it is relatively low, 1.8 to 3 volts. For instance when the supply voltage is 1.8 volts and the signal is superposed on a DC voltage of 0.9 volts, then the effective supply voltage is only 1.1 volts because the diode's voltage loss is 0.7 volt. In addition, the range of amplitude about the DC voltage (0.9 V) is only ±0.2. Accordingly, the silicon diode cannot be used when the supply voltage is low.

Instead of the above-described silicon diode, a germanium diode may be used and be operated on low voltage; however, it is still disadvantageous in that the use of the germanium diode obstructs the provision of the whole circuit in the form of an integrated circuit and the manufacturing cost is increased.

Furthermore, it is necessary that the non-linear integration circuit according to the invention is generally interchangeable with other such circuits in a sound recording and reproducing device. Accordingly, it is also required that the non-linear integration circuit according to the invention be similar in characteristic to that which employs a silicon diode which is generally used.

SUMMARY OF THE INVENTION

Accordingly, an object of this invention is to provide a non-linear integration circuit which responds quickly to an abrupt increase in the amplitude of an input signal.

Another object of the invention is to provide a non-linear integration circuit which operates on a low supply voltage and can be provided in the form of an integrated circuit on a silicon semiconductor substrate.

A further object of the invention is to provide a non-linear integration circuit which gives interchangeability to acoustic devices which employ the non-linear integration circuits of this type in the audio signal suppressing and expanding circuits.

A still further object of the invention is to provide a non-linear integration circuit having a hybrid circuit which is similar in voltage-current (V-I) characteristic to a silicon diode. The hybrid circuit, hereinafter, will be referred to as an "analogous diode".

The foregoing objects and other objects of the invention have been achieved by the provision of a non-linear integration circuit which, according to the invention, comprises: a rectifier circuit; a smoothing circuit having a resistor and capacitors connected respectively to both ends of the resistor; detecting means for detecting a potential difference between the two ends of the resistor; and an "analogous diode" which is controlled by the detecting means.

The nature, principle and utility of the invention will become more apparent from the following detailed description when read in conjunction with the accompanying drawings.

BRIEF DESCRIPTION OF THE DRAWINGS

In the accompanying drawings:

FIG. 3 is a circuit diagram for a description of the principle of a non-linear integration circuit according to this invention; and FIGS. 4 through 7 are circuit diagrams showing various examples of the non-linear integration circuit according to the invention.

DETAILED DESCRIPTION OF THE INVENTION

Figure 1:
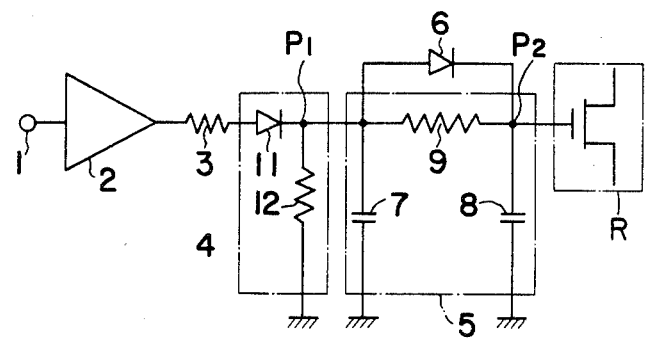
FIG. 1 is a circuit diagram showing a conventional non-linear integration circuit.

FIG. 3 is a circuit diagram showing the principle of a non-linear integration circuit according to this invention. A rectifier circuit 4 and a smoothing circuit 5 in FIG. 3 are the same as those in FIG. 1. In FIG. 1, the diode 6 is connected in parallel to the resistor 9; while in FIG. 3 an analogous diode 17 comprising a PNP transistor 13 and a resistor 14 is connected in parallel to the resistor 9. The analogous diode 17 is controlled by a differential amplifier 15 adapted to detect the potential difference between the terminals $P_1$ and $P_2$ of the resistor 9. The non-inversion input terminal (+) of the differential amplifier 15 is connected to the terminal P₁, and the inversion input terminal (−) is connected through a reference voltage source 10 to the terminal P₂. The output terminal of the differential amplifier 15 is connected to the base of a transistor 18, the collector of which is connected to the base of the PNP transistor 13.

Figure 2:
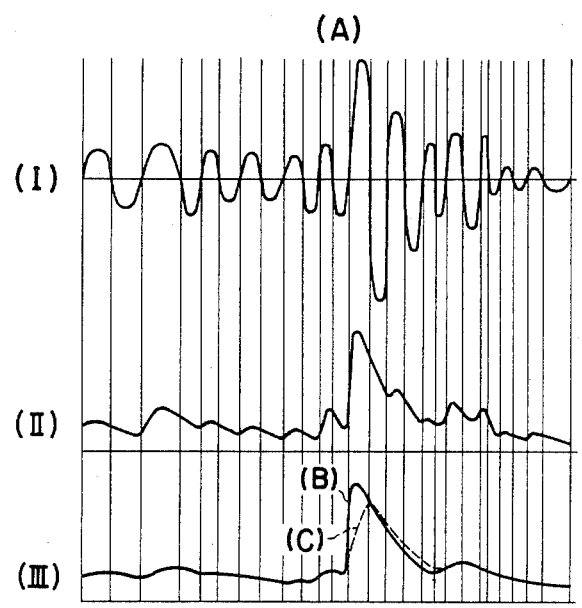
FIG. 2 is a waveform diagram for a description of the operation of the non-linear integration circuit.

It is assumed that a sine wave signal as shown in part (I) of FIG. 2 is applied to the input terminal, and the potential at the point P₁ is abruptly increased as indicated at (A) in part (II) of FIG. 2, so that a potential difference occurs between the terminals P₁ and P₂ of the resistor 9, the level of which exceeds the reference voltage 10. In this case, the differential amplifier 15 operates to apply a base current to the transistor 18, so that the latter 18 is turned on. As a result, the transistor 18 draws the base current of the PNP transistor 13, and the analogous diode 17 is operated. That is, charging current flows quickly into the smoothing capacitor 8 through the transistor 13. Thus, even when the amplitude of the input signal changes abruptly, a DC output as indicated at (B) in part (III) of FIG. 2 can be obtained without delay.

When the PNP transistor 13 of the analogous diode 17 is in the saturated state, the collector-emitter voltage $V_{CE(SAT)}$ is about 0.2 volt, and therefore with the analogous diode, unlike the silicon diode, the voltage loss is very small. The resistor 14 is connected to the collector of the PNP transistor 13, so that the V-I characteristic of the analogous diode 17 is more similar to that of the silicon diode. The reference voltage source 10 is connected to the inversion input terminal (−) of the differential amplifier 15; however, a method in which the differential amplifier 15 is offset in advance may be employed.

A first example of the non-linear integration circuit of the invention is as shown in FIG. 4.

In the example, its analogous diode 17 is made up of three PNP transistors 19, 20 and 21 and resistors 22, 23 and 24 which are connected respectively to the collectors of these transistors. The emitters of the transistors 19, 20 and 21 are connected to the point P₁, and the other terminals of the resistors 22, 23 and 24 are connected to the point P₂. The bases of the transistors 19, 20 and 21 are connected to the base of the transistor 18. The resistors 22, 23 and 24 are different in resistance from one another. Thus, the V-I characteristic of the analogous diode 17 becomes more similar to that of the silicon diode in this case also.

Figure 5:
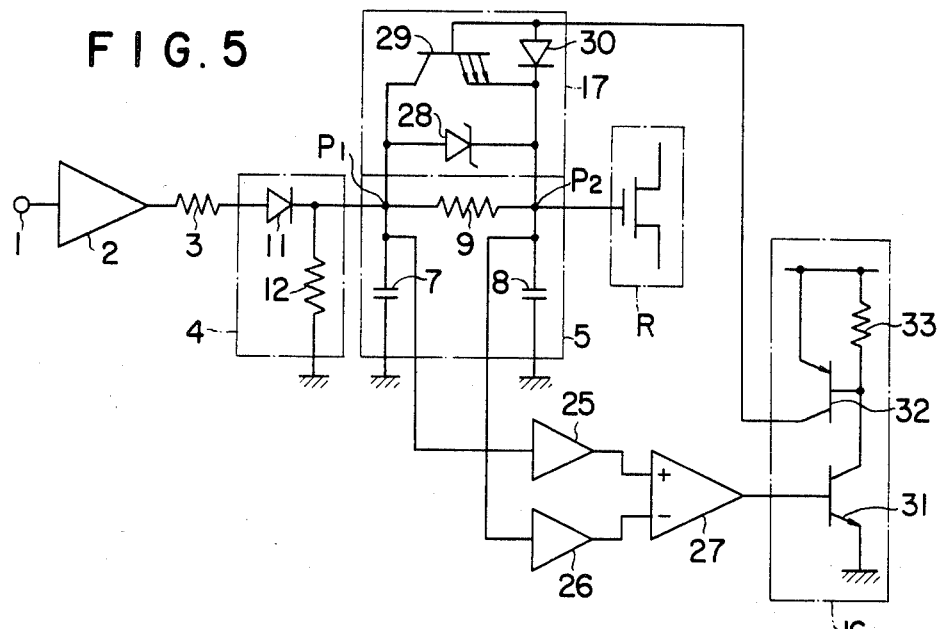

A second example of the non-linear integration circuit according to the invention is as shown in FIG. 5.

In this example, its analogous diode 17 comprises a Schottky diode 28 and an NPN transistor. The potentials at the terminals P₁ and P₂ of the resistor 9 are applied through amplifiers 25 and 26 to the non-inversion input terminal (+) and the inversion input terminal (−) of an error amplifier 27, respectively, so that the potential difference between the terminals P₁ and P₂ is detected. The output of the amplifier 27 is applied through a drive circuit 16 to the analogous diode 17 to control analogous diode 17. In the drive circuit 16, the base of an NPN transistor 31 is connected to the output terminal of the error amplifier 27, the collector of the transistor 31 is connected to a resistor 33, and the collector of a PNP transistor 32 is connected to the base of the NPN transistor 29, the PNP transistor 32 being biased by a voltage across the resistor 33.

This analogous diode is most suitable when the supply voltage is relatively low, because the Schottky diode 28 has a threshold voltage of about 0.3 volt; however, in a range of large current, its V-I characteristic is not similar to that of the silicon diode. Thus, such dissimilarity is complemented by the employment of the NPN transistor 29. Since the potentials at the points P₁ and P₂ are very low, the analogous diode can be controlled more accurately by supplying the potentials through the amplifiers 25 and 26.

In FIG. 5, reference numeral 30 designates a diode which is used to reduce the fluctuation in current amplification factor of the transistor 29, thus improving the V-I characteristic of the analogous diode.

Figure 6:
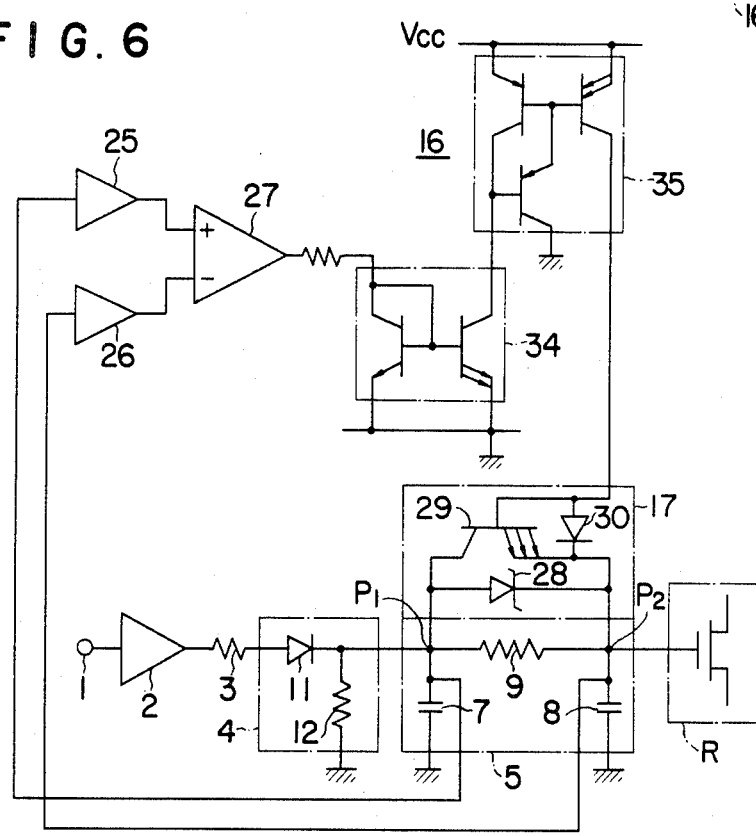

In a third example of the non-linear integration circuit of the invention as shown in FIG. 6, drive circuit 16 is different from that in FIG. 5. That is, the output of the error amplifier 27 is applied through current mirror circuits 34 and 35 to the analogous diode 17. In this case, the current applied to the analogous diode is controlled with higher accuracy, so that the V-I characteristic thereof is similar to that of the silicon diode.

Figure 7:
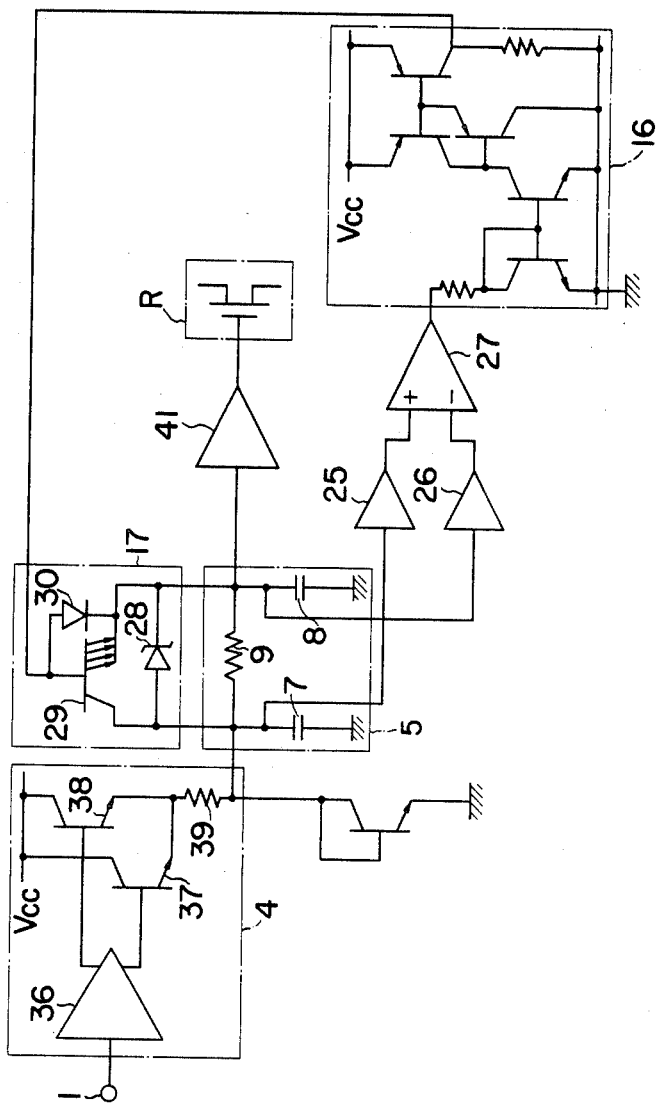

A fourth example of the non-linear integration circuit according to the invention is as shown in FIG. 7.

In this example, rectifier circuit 4 is a full-wave rectifier circuit which is made up of a differential amplifier 36 and emitter-follower-connected transistors 37 and 38. The outputs of the differential amplifier 36, which are opposite to each other, are applied to the bases of the transistors 37 and 38. The outputs of the transistors 37 and 38 are superposed, the resultant signal being applied to a resistor 39. While the rectifier circuit 4 in each of FIGS. 3, 4, 5 and 6 is a half-wave rectifier circuit, the fourth example employs a full-wave rectifier circuit. Therefore, the output is larger, which facilitates signal processing in the next stage.

Application of a full-wave rectifier circuit to the other examples will improve the effects thereof.

As is apparent from the above description, the non-linear integration circuit according to the invention comprises: the smoothing circuit for smoothing the output of the rectifier circuit; the analogous diode connected to the smoothing circuit; the differential amplifier for detecting the potential difference between the terminals of the resistor in the smoothing circuit; and the circuit for controlling the artificial diode according to the output of the error amplifier, and the compound element having a threshold level of 0.2 to 0.3 volt is used so that the analogous diode functions even when the supply voltage is relatively low; that is, the saturation voltage $V_{CE(SAT)}$ of the transistor or the Schottky diode is utilized. In addition, the voltage across the resistor in the smoothing circuit is detected to control the analogous diode, so that the V-I characteristic of the latter is similar to that of the silicon diode. Thus, interchangeability can be given to devices having a signal suppressing and expanding circuit for audio signals, which uses the non-linear integration circuit of this type. That is, even if sound signals recorded with an acoustic device operating on a low supply voltage is reproduced with an acoustic device operating on a high supply voltage, the reproduced sounds are not distorted.

Furthermore, the non-linear integration circuit according to the invention can respond quickly to an abrupt change in amplitude of the input signal. The Schottky diode in the invention can be manufactured according to the ordinary bipolar process because it can be formed with silicone and aluminum film. Therefore, the non-linear integration circuit of the invention has a low manufacturing cost.

What is claimed is:

1. A non-linear integration circuit comprising a rectifier circuit; a smoothing circuit having a resistor across which an output voltage of said rectifier circuit is applied, a first capacitor connected to an input terminal of said resistor and a second capacitor connected to an output terminal thereof; a hybrid diode for varying an impedance between said terminals of said resistor; and an error amplifier which detects a potential difference between said terminals of said resistor and controls a gain of said hybrid diode; whereby a potential difference, which is induced between said terminals of said resistor when an amplitude of an input signal supplied to said smoothing circuit by said rectifier circuit increases abruptly, is detected by said error amplifier which controls said hybrid diode to decrease said impedance of said resistor, to cause a charging current to flow rapidly into said second capacitor and to provide a smoothed output signal.

2. A non-linear integration circuit as claimed in claim 1, in which said hybrid diode includes a Schottky diode.

3. A non-linear integration circuit as claimed in claim 1, in which said hybrid diode includes a first resistor and a transistor, a first electrode of said transistor is connected to one terminal of a second resistor included in said smoothing circuit, a second electrode of said transistor is connected to one terminal of said first resistor, and the other terminal of said first resistor is connected to the other terminal of said second resistor.

4. A non-linear integration circuit as claimed in claim 1, in which said error amplifier includes a differential amplifier, the input side terminal of said resistor in said smoothing circuit is connected through a first amplifier to a non-inversion input terminal of said differential amplifier, and the output side terminal of said resistor is connected through a second amplifier to an inversion input terminal of said differential amplifier.

5. A non-linear integration circuit as claimed in claim 1, in which said rectifier circuit is a full-wave rectifier circuit.

6. A non-linear integration circuit as claimed in claim 5, in which said full-wave rectifier circuit is composed of emitter-follower-connected transistors and a differential amplifier the outputs of which are opposite to each other and are received by said transistors thereby to provide the resultant signal to the smoothing circuit.

7. A non-linear integration circuit which comprises:
a full-wave rectifier circuit;
a smoothing circuit having a resistor and first and second capacitors which are connected respectively to both terminals of said resistor;
an error amplifier for detecting potentials at both said terminals of said resistor;
a hybrid diode comprising a Schottky diode connected in parallel to said resistor, a transistor having a collector connected to an anode of said Schottky diode and an emitter connected to a cathode of said Schottky diode, and a diode connected across a base and an emitter of said transistor; and
a control circuit receiving an output of said error amplifier and supplying a control voltage to said base of said transistor of said hybrid diode; whereby when an amplitude of an input signal supplied to said smoothing circuit by said rectifier circuit increases sharply, a potential difference across said terminals of said resistor is detected by said error amplifier which controls said hybrid diode to decrease an impedance across said resistor, to cause a charging current to flow rapidly through said hybrid diode into said second capacitor and to provide a smoothed output signal.

* * * * *